United States Patent [19]

Hirano

[11] Patent Number: 5,188,701
[45] Date of Patent: Feb. 23, 1993

[54] METHOD OF FABRICATING SEMICONDUCTOR DEVICE

[75] Inventor: Yoshio Hirano, Kawasaki, Japan

[73] Assignee: Fujitsu Limited, Kanagawa, Japan

[21] Appl. No.: 752,357

[22] Filed: Sep. 3, 1991

[30] Foreign Application Priority Data

Sep. 5, 1990 [JP] Japan .................... 2-236541

[51] Int. Cl.$^5$ .................... B44C 1/22; C03C 15/00; C03C 25/06
[52] U.S. Cl. .................... 156/626; 156/657; 156/345; 437/241
[58] Field of Search .............. 156/637, 626, 627, 642, 156/653, 657, 662, 345; 437/241

[56] References Cited

U.S. PATENT DOCUMENTS 4,710,261 12/1987 Dennis ........................ 156/626
4,980,017 12/1990 Kaji et al. .................... 156/642

FOREIGN PATENT DOCUMENTS 0099131 1/1985 European Pat. Off. .
0196259 3/1986 European Pat. Off. .
57-94574 6/1982 Japan .
61-134027 6/1986 Japan .
62-177928 8/1987 Japan .

OTHER PUBLICATIONS

"The Etching of Silicon Nitride in Phosphoric Acid with Silicon Dioxide as a Mask", Journal of Electrochemical Society-Solid State Science, vol. 114, No. 8, Aug. 1967, Manchester, New Hampshire, pp. 869-872.
"Process for Maintainign H3PO4 Concentration", IBM Technical Disclosure Bulletin, vol. 16, No. 11, Apr. 1974, New York US, pp. 3540-3541.
Patent Abstracts of Japan, vol. 13, No. 328 (C-612) 24 Jul. 1989.
Patent Abstracts of Japan, vol. 6, No. 180 (C-125) 14 Sep. 1982.
Patent Abstracts of Japan, vol. 14, No. 518 (E-1001) 14 Nov. 1990.

Primary Examiner—William A. Powell
Attorney, Agent, or Firm—Armstrong, Westerman, Hattori, McLeland & Naughton

[57] ABSTRACT

A method of fabricating a semiconductor device (8), including the step of etching a layer of silicon nitride (12) formed on the semiconductor device in a hot phosphoric acid solution (1). The etching step comprises the steps of preparing a means (4) for supplying a low concentration phosphoric acid solution having a predetermined concentration, detecting (3) a temperature of the hot phosphoric acid solution in the etching tank (2), starting a supply of the low concentration phosphoric acid solution to the etching tank when a predetermined time has elapsed (t) after the detected temperature of the hot phosphoric acid solution in the etching tank becomes higher than a first predetermined temperatures ($T_1$), and stopping the supply of the low concentration phosphoric acid solution when the detected temperature of the hot phosphoric acid solution becomes lower then a second predetermined temperature ($T_2$) which is lower than the first predetermined temperature.

8 Claims, 5 Drawing Sheets

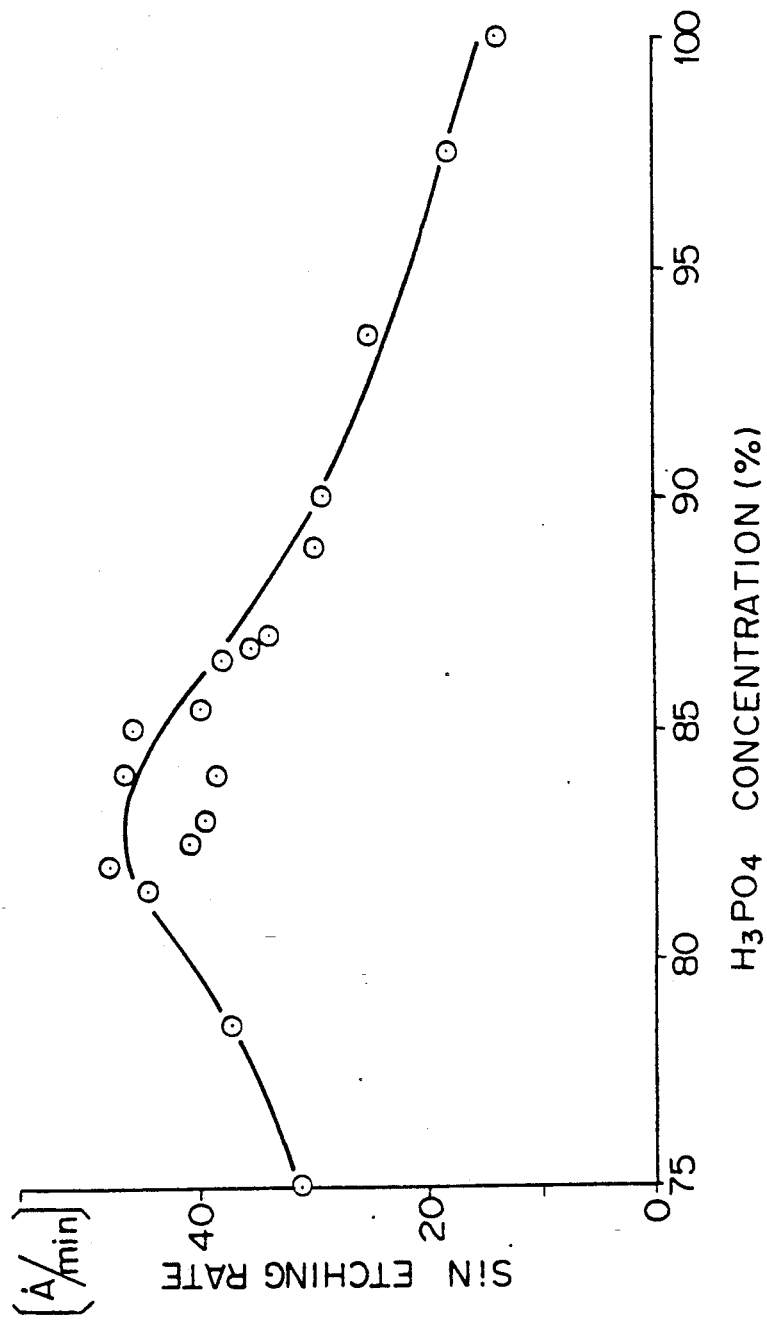

METHOD OF FABRICATING SEMICONDUCTOR DEVICE

BACKGROUND OF THE INVENTION

1. Field of the Invention

The present invention relates to a method of fabricating a semiconductor device. In particular, it relates to a process of etching a layer of silicon nitride formed on the semiconductor device by immersing the semiconductor device in a hot phosphoric acid solution.

2. Description of the Related Art

In the fabrication of semiconductor devices, a layer of silicon nitride is used as a selective localized oxidation mask or as an insulating layer. This mask must be removed from the semiconductor device, i.e., from a semiconductor substrate on which the mask is formed, and thus the mask is removed by etching. A dry etching has been developed, but such a dry etching is not capable of a selective etching. Accordingly, a wet etching using a hot phosphoric acid solution is preferred when a selective removal of the layer of silicon nitride from a layer of silicone dioxide is desired.

This wet etching is carried out by immersing the semiconductor device, having the layer of silicon nitride formed thereon, in a hot phosphoric acid solution, which is controlled to a boiling condition at a temperature of one hundred and several tens of degrees Centigrade. An evaporation loss of water in the hot phosphoric acid causes the latter to be inspissated, and thus a conventional method utilizes an intermittent supply of a constant volume of a low concentration phosphoric acid solution. The hot phosphoric acid solution is heated to a constant temperature, but the temperature of the hot phosphoric acid solution falls below the boiling point just after the low concentration phosphoric acid solution is supplied, and this temperature drop causes a reduction of the etching rate, and therefore, the etching process takes a longer time than actually needed.

As a result, because the etching time is prolonged, the surface of the silicon dioxide is exposed to the hot phosphoric acid solution after the silicon nitride has been removed, and thus impurities are often deposited on the exposed surface. Accordingly, variations of the quality of the etching may increase, and the manufacturing output thus decreased.

There are known techniques regarding the wet etching using a hot phosphoric acid solution; for example, Japanese Patent Unexamined Patent Publication (Kokai) No. 57-94574 discloses an invention in which the concentration of the phosphoric acid solution is controlled based on the specific gravity of the latter, No. 61-134027 discloses an invention in which water is supplied in correspondence with an evaporated loss, by detecting the liquid level of the phosphoric acid solution, and No. 62-177928 discloses an invention in which a pressure vessel is used to prevent an escape of water in the phosphoric acid solution from the vessel. Nevertheless, these prior arts still suffer from the above-described problems.

SUMMARY OF THE INVENTION

The object of the present invention is to solve the above-described problems by providing a method of fabricating a semiconductor device by which an etching of a layer of silicon nitride by using a hot phosphoric acid solution is effectively and stably carried out, to thereby provide the semiconductor device with a uniform property and increase the output thereof.

According to the present invention, there is provided a method of fabricating a semiconductor device, this method including the step of etching a layer of silicon nitride formed on the semiconductor device by immersing the semiconductor device in a hot phosphoric acid solution contained in an etching tank and heated by a heating means, the hot phosphoric acid solution being controlled to be within a predetermined concentration range. This method is characterized in that the etching step comprises the steps of preparing a means for supplying a low concentration phosphoric acid solution having a predetermined concentration lower than the predetermined concentration range of the hot phosphoric acid solution in the etching tank, detecting a temperature of the hot phosphoric acid solution in the etching tank, starting a supply of the low concentration phosphoric acid solution into the etching tank, at a predetermined point after the detected temperature of the hot phosphoric acid solution in the etching tank becomes higher than a first predetermined temperature, and stopping the supply of the low concentration phosphoric acid solution into the etching tank when the detected temperature of the hot phosphoric acid solution in the etching tank becomes lower than a second predetermined temperature which is lower than the first predetermined temperature.

In the present method, the hot phosphoric acid solution is heated to boiling point, and if water is not supplied, is inspissated. Accordingly, the low concentration phosphoric acid solution is supplied when the detected temperature of the hot phosphoric acid solution in the etching tank exceeds the first predetermined temperature, in correspondence with a predetermined concentration. This causes a lowering of the concentration and the temperature of the hot phosphoric acid solution in the etching tank, and therefore, when the detected temperature of the hot phosphoric acid solution in the etching tank becomes lower than the second predetermined temperature, the supply of the low concentration phosphoric acid solution is stopped until the detected temperature again exceeds the first predetermined temperature. Accordingly, it is possible to control the temperature and the concentration of the etching phosphoric acid solution to within the respective predetermined ranges, to thereby maintain the etching rate of the silicon nitride at a substantially constant value.

Namely, the present invention provides a method of fabricating a semiconductor device based on a combination of a detection of a boiling point of the solution and a supply of a low concentration phosphoric acid solution thereto, and such a combination is different from the conventional techniques as described above.

BRIEF DESCRIPTION OF THE DRAWINGS

The present invention will becomes more apparent from the following description of the preferred embodiments, with reference to the accompanying drawings, in which:

- FIG. 4 is graph illustrating the concentration of the phosphoric acid solution versus the etching rate of the silicon nitride.

DESCRIPTION OF THE PREFERRED EMBODIMENTS

Figure 1:
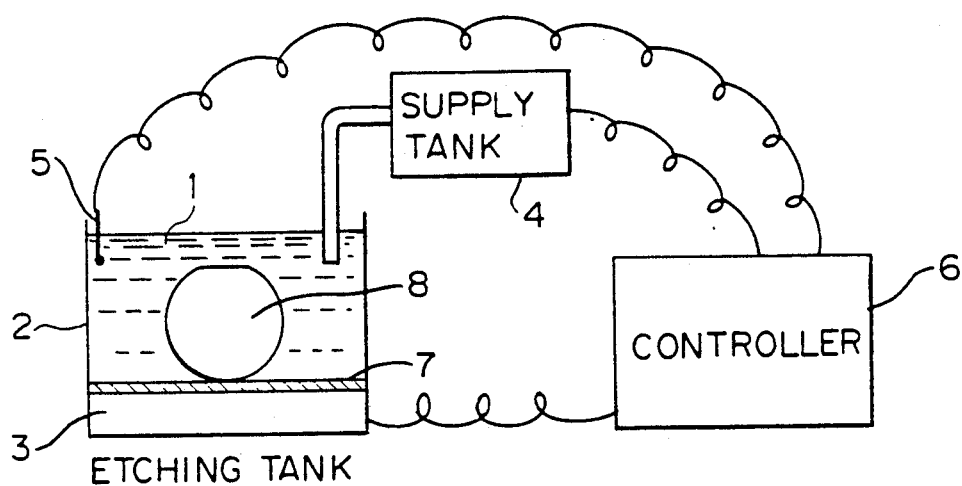
FIG. 1 is a diagrammatic view of an etching device according to the embodiment of the present invention.

FIG. 1 shows the etching device according to the present invention, which comprises an etching tank 2 made from, for example, a quartz, and containing a hot phosphoric acid solution 1. A semiconductor device 8 can be immersed in the hot phosphoric acid solution 1. A heater, for example, an anti-corrosive immersion heater 3, is arranged in the etching tank 2 to heat the hot phosphoric acid solution 1 to the boiling point thereof. A supply tank 4 contains a low concentration phosphoric acid solution, and is connected to the etching tank 2 via a valve means (not shown) to thereby supply the low concentration phosphoric acid solution to the etching tank 2. A temperature sensor 5 is arranged in the etching tank 2, to detect the temperature of the hot phosphoric acid solution 1, and signals output by the temperature sensor 5 are input to a controller 6 which controls the heater 3 and valve means of the supply tank 4. A means 7 for stirring the hot phosphoric acid solution 1 is arranged in the etching tank 2, and in the preferred embodiment, this means 7 comprises a perforated duct emitting bubbles of nitrogen gas.

Figure 5A:
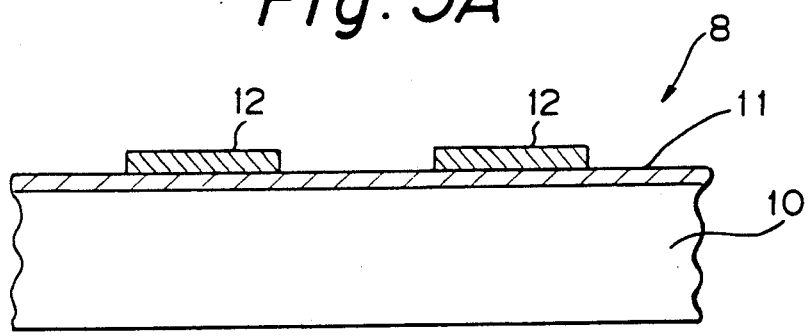
FIGS. 5A to 5C are views illustrating the fabrication steps of the semiconductor device.
Figure 5B:
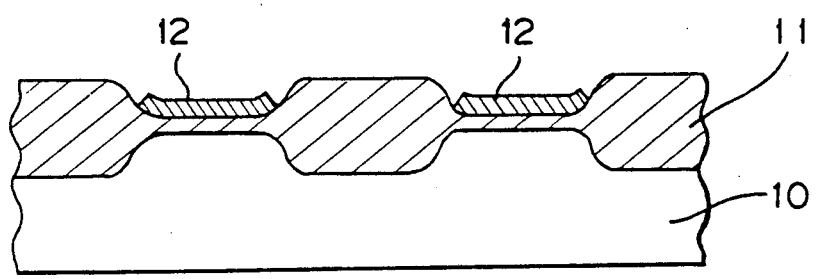
Figure 5C:
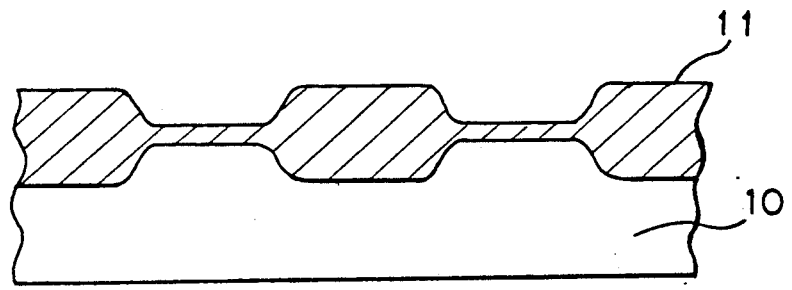

FIGS. 5A to 5C show fabrication steps of the semiconductor device 8 having a LOCOS structure (localized oxidation of silicone). The semiconductor device 8 comprises a semiconductor substrate 10, a layer of silicon dioxide 11, and a layer of silicon nitride 12. FIG. 5A shows a step in which the layer of silicon dioxide 11 is formed on the semiconductor substrate 10, and the layer of silicon nitride 12 is formed as a mask on the layer of the silicon dioxide 11. FIG. 5B shows the next oxidation step, known as LOCOS oxidation, in which parts of the silicon dioxide layer 11 exposed by the layer of silicon nitride 12 are made thicker and parts of the silicon dioxide layer 11 covered by the layer of silicon nitride 12 are made thinner. FIG. 5C shows the next etching step in which the layer of silicon nitride 12 is removed, and this etching step is carried out by the etching device shown in FIG. 1.

FIG. 4 is graph illustrating the weight concentration of the hot phosphoric acid solution versus the etching rate of the silicon nitride. It is known that the etching rate of the silicon nitride is highest when the hot phosphoric acid solution 1 has a concentration of approximately 83 percent, and is brought to the boiling point at that concentration. As will be understood, the boiling point of the hot phosphoric acid solution 1 at the concentration of 83 percent is approximately 150° C., and the boiling point of the hot phosphoric acid solution 1 becomes higher with an increase of the concentration. As shown in FIG. 4, the maximum etching rate is 46 angstroms per minute at a concentration of approximately 83 percent and a boiling point of approximately 150° C. The etching rate is lowered even if the concentration is further increased; for example, the etching rate at a concentration of approximately 95 percent is 22 angstroms per minute.

The control device 6 in FIG. 1 comprises a microcomputer unit having a clock therein, and controls the heater 3 and valve means of the supply tank 4 so that the hot phosphoric acid solution 1 is maintained at a weight concentration of approximately 83 percent and a boiling point of approximately 150° C. This is carried out according to the flow chart of FIG. 2, and the change of the temperature is as shown in FIG. 3.

Figure 2:
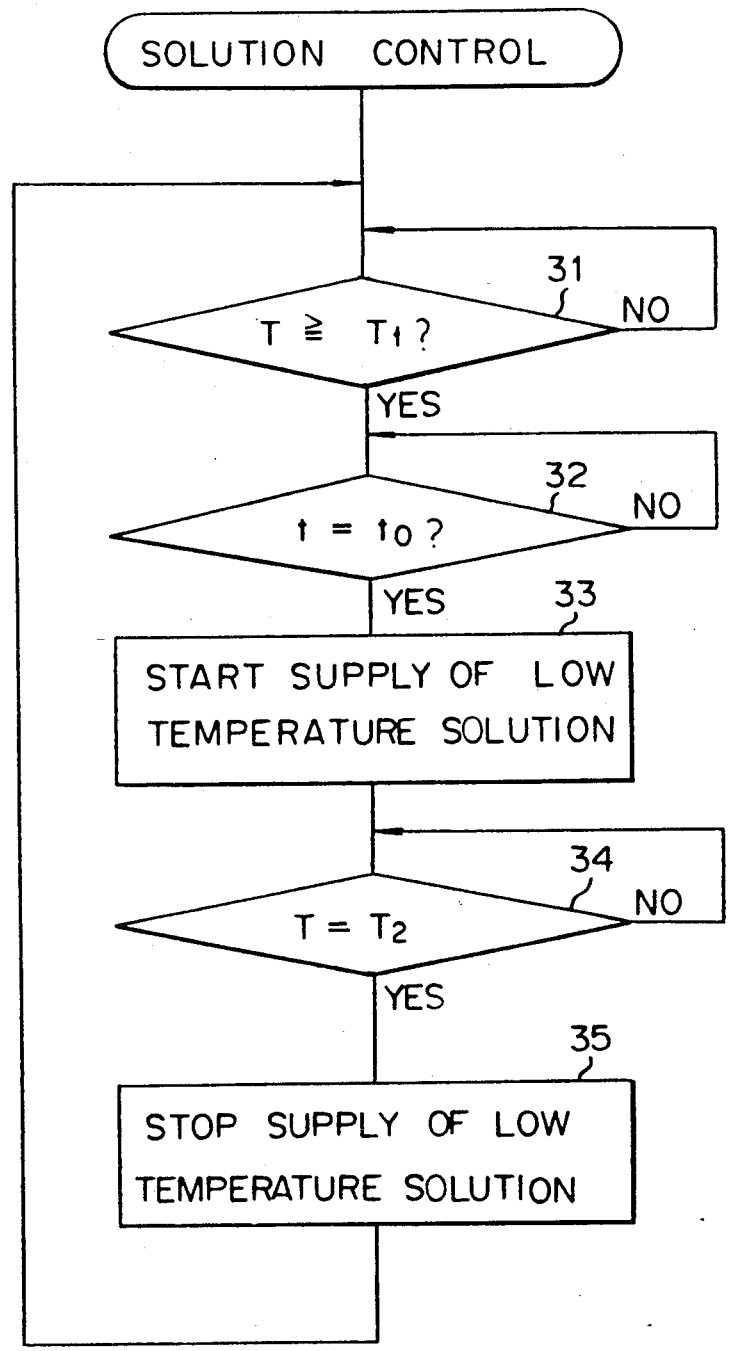
FIG. 2 is a flow chart of a control of a supply of the low concentration phosphoric acid solution.
Figure 3:
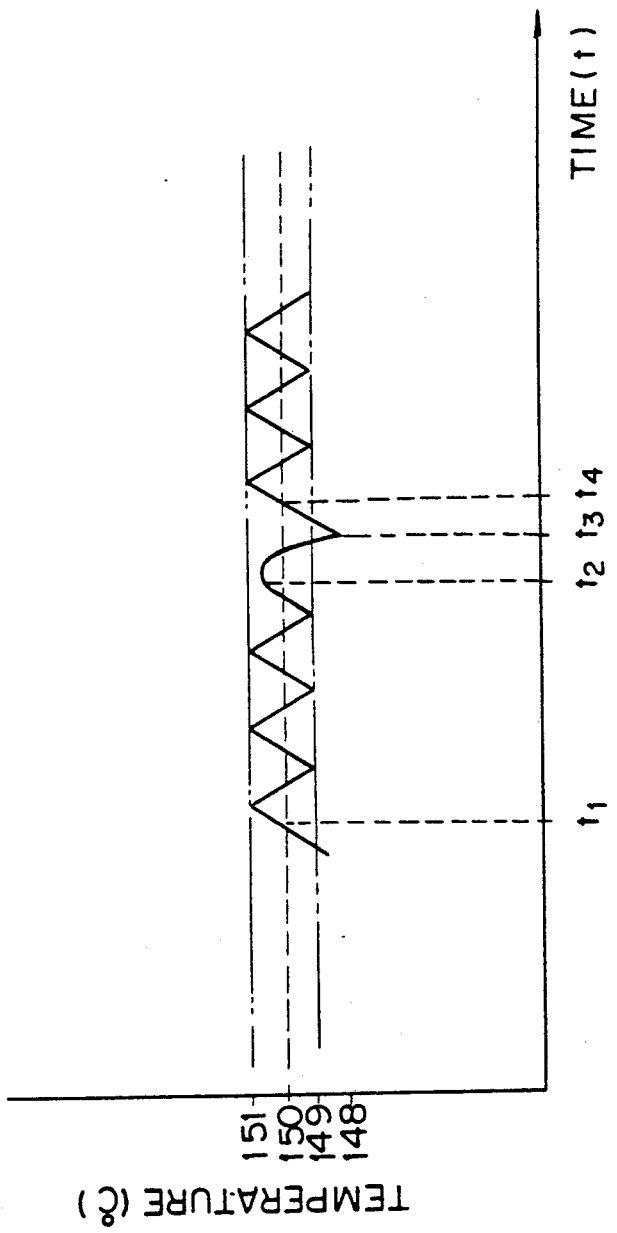
FIG. 3 is a timing chart of a control of a supply of the low concentration phosphoric acid solution and a con

As shown in block 31 in FIG. 2, it is determined whether or not the detected temperature T is higher than a first predetermined temperature $T_1$, i.e., 150° C. in this embodiment. Referring to FIG. 3, the temperature control is carried out by a separate routine, and the temperature of the hot phosphoric acid solution 1 is controlled to within a predetermined temperature range having an upper limit of 151° C. and a lower limit of 149° C., i.e., approximately 150° C. The first predetermined temperature $T_1$ may be equal to or slightly higher than 150° C.

This temperature detection is carried out while the temperature is rising out of the temperature control range and the heater 3 is continuously switched on, and thus the judgment at block 31 may be YES at the time $t_1$. Then, at block 32, it is determined whether or not a predetermined point "t" is reached after the detected temperature has become higher than the first predetermined temperature $T_1$. This predetermined point can be defined by a further rise of the temperature or the elapse of a predetermined time, and is determined based on an estimate of an evaporation rate of the hot phosphoric acid solution 1. In the preferred embodiment, the block 32 determines whether or not a predetermined time "$t_0$" has elapsed after the detected temperature becomes higher than the first predetermined temperature $T_1$. Referring to FIG. 3, this detection is made at the time $t_2$, where $t_0 = t_2 - t_1$. The predetermined time "$t_0$" is 5 minutes in the present embodiments, and the heater 3 is switched on or off during this predetermined time "$t_0$", to carry out the etching under a substantially constant temperature condition.

Then, at block 33, the controller 6 outputs a control signal to the valve means of the supply tank 4, to thereby start a supply of the low concentration phosphoric acid solution from the supply tank 4 into the etching tank 2. The low concentration phosphoric acid solution in the supply tank 4 has a concentration of 8 (weight) percent, and since it is not heated, is at room temperature. The low concentration phosphoric acid solution is supplied, for example, at a rate of 80 ml/min, and therefore, the temperature of the hot phosphoric acid solution 1 is gradually lowered even though the heater 3 is kept switched on.

Then, at block 34, it is determined whether or not the detected temperature T is lower than a second predetermined temperature $T_2$ which is lower than the first predetermined temperature $T_1$. The second predetermined temperature $T_2$ in the embodiment is 148° C. When the judgment at block 34 becomes YES at the time $t_3$, the process proceeds to block 35 and the controller 6 outputs a control signal to the valve means of the supply tank 4, to thereby stop the supply of the low concentration phosphoric acid solution. Then the temperature of the hot phosphoric acid solution 1 in the etching tank 2 rises and again reaches the first predetermined temperature $T_1$ at the time $t_4$, and thereafter, the above cycle is repeated.

It has been proved that the variation of the concentration of the hot phosphoric acid solution 1 is ±2 percent for the desired concentration of 83 percent. It will be noted that the exemplified values for the temperature may be modified in accordance with the arrangement of the etching device; for example, according to the volume of the hot phosphoric acid solution 1 in the etching tank 2 and the heating capacity of the heater 3.

As explained above, it is possible to carry out the etching of the silicon nitride layer at an appropriate etching time by using the hot phosphoric acid solution under properly controlled concentration and temperature conditions, according to the present invention, to thereby greatly shorten the usual prolonged etching time, and thus, it is possible to obtain a more effective etching operation. Also, excess etching is eliminated, and as a result, it is possible to provide the semiconductor device with a uniform property at an increased output. In addition, the present invention not only supplies water lost from the phosphoric acid solution, but also replaces a portion of the phosphoric acid solution consumed by the etching, and thus it is easy to reliably maintain and control the desirable etching conditions, and to prolong the maintenance period needed for the replacement of the etching solution or the like.

I claim:

1. A method of fabricating a semiconductor device, said method including the step of etching a layer of silicon nitride formed on the semiconductor device by immersing the semiconductor device in a hot phosphoric acid solution contained in an etching tank and heated by a heating means, the hot phosphoric acid solution being controlled to be within a predetermined concentration range, characterized in that the etching step comprises the steps of:

preparing a means for supplying a low concentration phosphoric acid solution having a predetermined concentration lower than the predetermined concentration range of the hot phosphoric acid solution in the etching tank;

detecting a temperature of the hot phosphoric acid solution in the etching tank;

starting a supply of the low concentration phosphoric acid solution to the etching tank at a predetermined point after the detected temperature of the hot phosphoric acid solution in the etching tank becomes higher than a first predetermined temperature; and stopping the supply of the low concentration phosphoric acid solution to the etching tank when the detected temperature of the hot phosphoric acid solution in the etching tank becomes lower than a second predetermined temperature which is lower than the first predetermined temperature.

2. A method according to claim 1, wherein the hot phosphoric acid solution has a predetermined boiling point at a predetermined concentration, and the first predetermined temperature is equal to or higher than the boiling point.

3. A method according to claim 1, wherein the hot phosphoric acid solution is maintained within a predetermined concentration of approximately 83 percent.

4. A method according to claim 1, wherein the predetermined point is a predetermined temperature rise from the first predetermined temperature.

5. A method according to claim 1, wherein the predetermined point is a predetermined time elapsed from the time at which the detected temperature of the hot phosphoric acid solution becomes higher than the second predetermined temperature.

6. A method according to claim 1, wherein the hot phosphoric acid solution has a boiling point of approximately 150° C. at the concentration of approximately 83 percent, and the temperature of the hot phosphoric acid solution is controlled within a predetermined temperature range of approximately 150° C.

7. A method according to claim 6, wherein the temperature of the hot phosphoric acid solution is controlled within a predetermined temperature range between an upper limit value and a lower limit value around 150° C., the first predetermined temperature being equal to or higher than 150° C. and the second predetermined temperature being lower than 150° C.

8. An etching device for etching a layer of silicon nitride formed on a semiconductor device, said device comprising:

an etching tank containing a hot phosphoric acid solution controlled to be within a predetermined concentration range and incorporating therein a heating means;

a supply tank containing a low concentration phosphoric acid solution having a predetermined concentration lower than the predetermined concentration range of the hot phosphoric acid solution in the etching tank;

means for detecting a temperature of the hot phosphoric acid solution in the etching tank;

control means for controlling the concentration of the hot phosphoric acid solution in the etching tank to within the predetermined concentration range, the control means comprising means for starting a supply of the low concentration phosphoric acid solution from the supply tank to the etching tank at a predetermined point after the detected temperature of the hot phosphoric acid solution in the etching tank becomes higher than a first predetermined temperature, and means for stopping the supply of the low concentration phosphoric acid solution from the supply tank to the etching tank when the detected temperature of the hot phosphoric acid solution in the etching tank becomes lower than a second predetermined temperature which is lower than the first predetermined temperature.

* * * * *